United States Patent [19]
Isohata et al.

[11] Patent Number: 4,708,466
[45] Date of Patent: Nov. 24, 1987

[54] EXPOSURE APPARATUS

[75] Inventors: Junji Isohata, Tokyo; Makoto Miyazaki, Yokohama, both of Japan

[73] Assignee: Canon Kabushiki Kaisha, Tokyo, Japan

[21] Appl. No.: 10,481

[22] Filed: Feb. 3, 1987

[30] Foreign Application Priority Data

Feb. 7, 1986 [JP] Japan ................................ 61-024066
Feb. 7, 1986 [JP] Japan ................................ 61-024067

[51] Int. Cl.$^4$ ............................................. G03B 27/42
[52] U.S. Cl. ......................................... 355/53; 355/43
[58] Field of Search ....................... 355/43, 45, 53, 77, 355/72, 75, 76, 54

[56] References Cited

U.S. PATENT DOCUMENTS

| | | | |
|---|---|---|---|
| 4,464,030 | 8/1984 | Gale et al. ........................ | 355/53 X |
| 4,653,903 | 3/1987 | Torigoe et al. ...................... | 355/53 |
| 4,659,225 | 4/1987 | Takahashi .......................... | 355/53 X |
| 4,676,630 | 6/1987 | Matsushita et al. .................. | 355/53 |
| 4,676,649 | 6/1987 | Phillips ............................. | 355/53 X |

Primary Examiner—Richard A. Wintercorn
Attorney, Agent, or Firm—Fitzpatrick, Cella, Harper & Scinto

[57] ABSTRACT

A step-and-repeat type exposure apparatus for photoprinting patterns on different portions of a workpiece, for the manufacture of a large-size pattern to be used in a panel display device, for example. Plural masks having respective patterns are used and, each time the pattern of one of the masks is transferred onto corresponding one of the portions of the workpiece, the workpiece is displaced while, on the other hand, the used mask is replaced by a subsequent mask. For the exposure of a first one of the portions of the workpiece, the first portion is aligned with a corresponding first mask, set at a reference position, by use of alignment marks provided on the first portion and the first mask. In regard to the exposure of a second one of the portions of the workpiece, the workpiece is moved while monitoring the position thereof by use of a laser interferometer, so that the second portion is brought into alignment with a second mask placed at the reference position.

10 Claims, 4 Drawing Figures

EXPOSURE APPARATUS

FIELD OF THE INVENTION AND RELATED ART

This invention relates to an exposure apparatus for photolithographically printing patterns on different portions of a workpiece, and, more particularly, it relates to an exposure apparatus usable for forming, on a workpiece and by step-and-repeat photolithographic exposures, a pattern or patterns of large size to be used in a flat panel display device such as a liquid crystal panel display device.

Exposure apparatuses for use in a photolithographic process are well known in the field of manufacture of semiconductor devices such as integrated circuits. The principle of photolithographic pattern transfer employed in such exposure apparatuses is usable in the formation of a pattern to be used in a display device. In the field of manufacture of display devices such as liquid crystal display devices, electroluminescence display devices, etc., development of flat panel type large-size display devices has been desired. The formation of a large-size pattern on a workpiece such as a glass plate by use of the photolithographic technique, is attainable by dividing the surface area of the workpiece into plural portions and by photoprinting pattern portions on respective surface portions of the workpiece. That is, the concept of step-and-repeat exposures is applicable to the formation of a large-size pattern on the workpiece.

In order to manufacture a panel display device, such as a liquid crystal panel display device, according to the photolithographic technique, it is necessary to repeat the photolithographic process so as to superimposingly print patterns on the workpiece. Namely, it is necessary to use several photomasks having different patterns and to superimposingly photoprint the images of these patterns on the workpiece or substrate, such as a glass plate. This leads to the necessity of alignment of the mask and the substrate, because the mask patterns must be accurately overlaid upon one another. In other words, the image of the pattern of one photomask must be accurately superimposed on the pattern or patterns which have already been photoprinted on the substrate. That is, except for a "first-mask process" using a first mask that has a pattern to be transferred onto a first layer on the workpiece, the alignment of the mask and the substrate is necessary.

In the field of manufacture of semiconductor devices, step-and-repeat type exposure apparatuses are prevalently used. In this type of exposure apparatuses, usually the alignment of a mask (or reticle) and a workpiece, which is a wafer in this case, is carried out for each of zones or shot areas on the wafer that are to be exposed to the mask pattern in sequence. For this purpose, one or more alignment marks are provided in association with each of the shot areas, and each shot area is brought into alignment with a predetermined reference by use of the alignment marks provided therefor. This is called "die-by-die alignment". According to such die-by-die alignment technique, each time the workpiece is stepwisely moved to feed the subsequent shot area to the exposure station, the so fed shot area is brought into alignment with the reference by using alignment marks provided therefor. This is very advantageous because, if the workpiece has been thermally expanded/contracted or regionally deformed, the image of the mask pattern can be projected on an exact position in each shot area.

However, the necessity of alignment for each shot area leads to prolongation of the time for the alignment and exposure operation, thus increasing the time necessary for processing one wafer and degrading the throughput of the apparatus.

In order to sequentially photoprint patterns on a workpiece in the step-and-repeat manner for manufacture of the panel display device, it is important that the patterns should be sequentially photoprinted on the same layer of the workpiece in a good juxtapositional or adjoining relation. The juxtaposition relation desired differs depending on the type of the display device that is going to be manufactured. In some cases, adjacent patterns photoprinted should partially overlap at the boundary therebetween. In other cases, on the other hand, it may be desired that adjacent patterns borders upon one another or they are spaced from each other to some degree. If the juxtaposing accuracy is not good, desired overlapping, bordering or separation is not attainable at the boundary between the patterns photoprinted, which makes it difficult to assure desired display performance.

SUMMARY OF THE INVENTION

It is accordingly a primary object of the present invention to provide an exposure apparatus of step-and-repeat type, by which, at the time of superimposing photoprinting, patterns can be accurately overlaid upon one another in each of different portions of a workpiece, without decreasing the throughput of the apparatus.

It is another object of the present invention to provide an exposure apparatus of step-and-repeat type, by which patterns can be photoprinted on different portions of the same layer of a workpiece with a good or desired juxtapositional accuracy.

It is a further object of the present invention to provide an exposure apparatus which is suitably usable for forming, on a workpiece and by step-and-repeat exposures, a pattern or patterns to be used in a flat panel display device.

Briefly, in accordance with one preferred form of the present invention, a photomask or mask having a pattern to be transferred onto a workpiece is positioned or aligned with a predetermined reference. In regard to the positioning of the workpiece, on the other hand, a first shot area of the workpiece is first positioned or aligned with the mask. That is, by using one or more alignment marks provided on the workpiece in association with the first shot area, any positional deviation of the first shot area with respect to the mask is measured or detected. Then, on the basis of the result of detection, the workpiece is moved so as to determine the position of the first shot area. Upon completion of such positioning, the exposure of the first shot area to the mask pattern is executed. Subsequently, for the photoprinting of a second shot area, the workpiece is moved stepwise to a predetermined position while measuring or monitoring the position of the workpiece by use of suitable measuring means such as a laser interferometer. After the workpiece reaches the predetermined position, the exposure of the second shot area is executed. The positioning of the remaining shot areas, if any, is executed in the same way as the positioning of the second shot area. It will be understood that no specific alignment time is necessary for the second shot area, the third shot area, etc. Accordingly, the time necessary for processing one workpiece is reduced and, therefore, the yield and throughput of the apparatus is improved.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
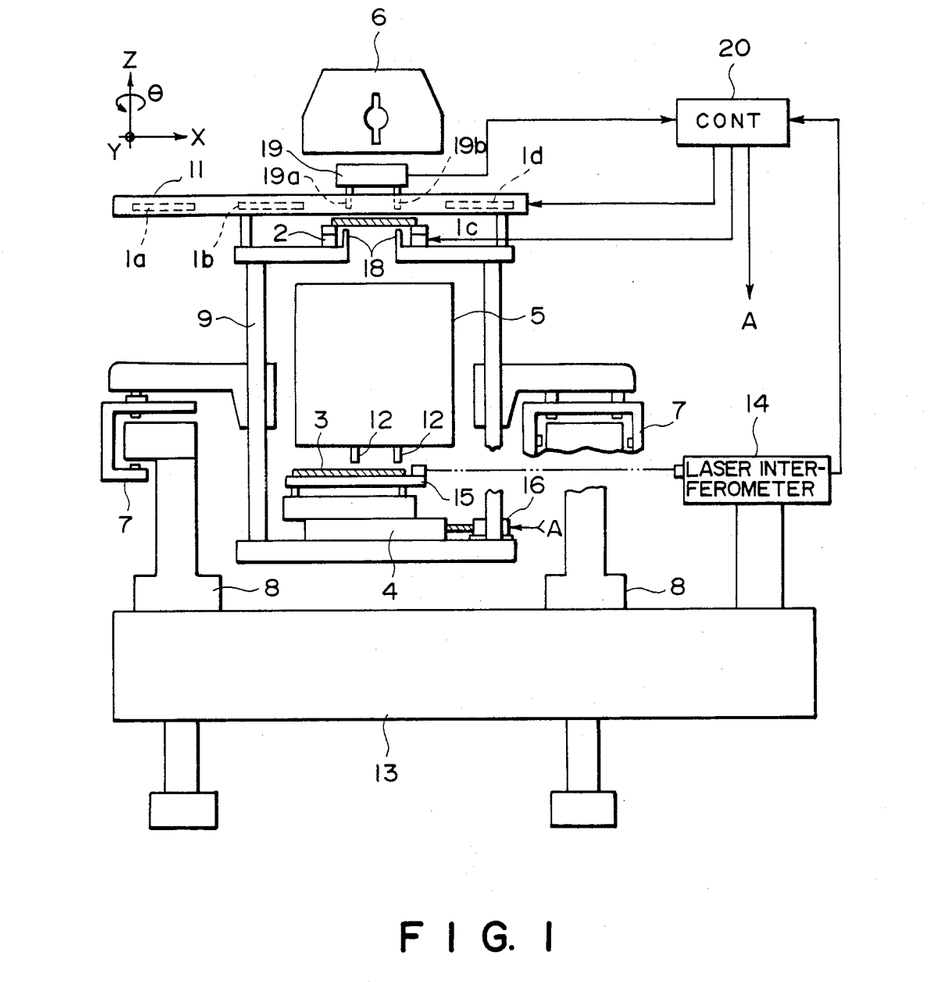
FIG. 1 is a schematic and diagrammatic view of an exposure apparatus according to one embodiment of the present invention.

Referring first to FIG. 1, there is shown a general structure of an exposure apparatus according to an embodiment of the present invention. In this embodiment, the present invention is applied to an exposure apparatus of "step-and-scan" type wherein a mirror projection system is used for scanningly expose different portions of a large-size workpiece in sequence.

As shown in FIG. 1, the exposure apparatus is usable with four photomasks 1 (1a, 1b, 1c and 1d) each having a fine pattern formed on its lower surface. The exposure apparatus includes a mask stage 2 for carrying thereon one of the masks 1a–1d at a time. The mask stage 2 is movable relative to a holder 9 in each of X, Y and $\theta$ (rotational) directions for fine adjustment of the position of the mask carried by the mask stage. Denoted in this Figure by numeral 3 is a glass substrate or base plate of rectangular shape having a diagonal length of an order of fourteen (14) inches. For the manufacture of a liquid crystal panel display device, for example, a number of displaying picture elements as well as switching transistors for controlling actuation and de-actuation of the picture elements, capacitors, connecting terminals and so on are to be formed on the surface of the glass base plate 3 by ordinary photolithographic processes. The glass base plate 3 is held by a base-plate carrying stage 4 which is movable relative to the holder 9 in each of the X, Y, Z and $\theta$ (rotational) directions. Also, the stage 4 is arranged to be moved stepwise in each of the X and Y directions, for the sake of plural-shot exposure (four-shot exposure in this case) of the glass base plate 3 as will be described later. Such step-feeding of the stage 4 is controlled by a fine movement-measuring system using a laser interferometer system 14. In FIG. 1, only the X-axis laser interferometer system is illustrated. The exposure apparatus further includes a mirror projection optical system 5 of known type, comprising a combination of trapezoidal, concave and convex mirrors. The mirror projection system is adapted to project, onto the glass base plate 3 at a unit magnification, an image of the pattern of one of the masks 1a–1d which is held at a predetermined position (exposure station) by the mask stage 2, more exactly at a reference position determined by a reference block 18 fixedly mounted on the holder 9.

An illumination optical system 6 includes a light source (not shown) for providing light of a predetermined wavelength or wavelength range to illuminate one of the masks held at the predetermined exposure station by the mask stage 2. By exposing a photosensitive layer formed on the glass base plate 3 to light passed through the pattern of the mask is held by the mask stage 2, the fine pattern of such mask is photolithographically transferred onto the glass base plate 3. The mirror projection system 5 is disposed such that its optical axis is accurately aligned with the optical axis of the illumination optical system 6.

Denoted by numerals 7 and 7 are linear air-bearing assemblies (hereinafter simply "LAB") which are movable along two guide rails 8 and 8, respectively, extending in the Y direction. One of these bearing assemblies (LAB) is of the type in which it is constrained with respect to movement in the X direction (positive and negative) and in a Z direction (positive and negative). The other of the bearing assemblies is of the type in which it is constrained with respect to movement in the Z direction. The holder or carriage 9 is supported by the LAB 8 and is adapted to support the mask stage 2 and the base-plate stage 4 in a stationary relation. With this arrangement, the mask 1 is carried by the mask stage and the glass base plate 3 carried by the base-plate stage 4 can be scanningly moved as a unit in the Y direction (or the direction of an arrow B in FIG. 2) relative to the projection system 5, during the exposure of the mask and the base plate to the light emitted from the illumination optical system 6. One complete movement of the carriage 9 is effective to achieve one scanning exposure relative to one-fourth ($\frac{1}{4}$) of the base plate 3 with corresponding mask 1a, 1b, 1c or 1d.

The exposure apparatus further includes a mask feeder 11 carrying the masks 1a–1d and for sequentially feeding the masks 1a–1d to the exposure station on the mask stage 2. That is, the mask feeder 11 is arranged to change masks each time the scanning exposure of one of different areas on the glass base plate 3 is completed. Gap sensors denoted by numeral 12 are provided to detect the distance between the surface of the base plate 3 and the focal plane of the projection optical system 5. For example, air-microsensors utilizing air pressure or photoelectric sensors utilizing reflection light from the base plate 3 are usable as the gap sensors. The projection optical system 5, the illumination optical system 6 and the guide rails 8 are supported by a base or surface plate 13 in a predetermined interrelation.

Figure 2:
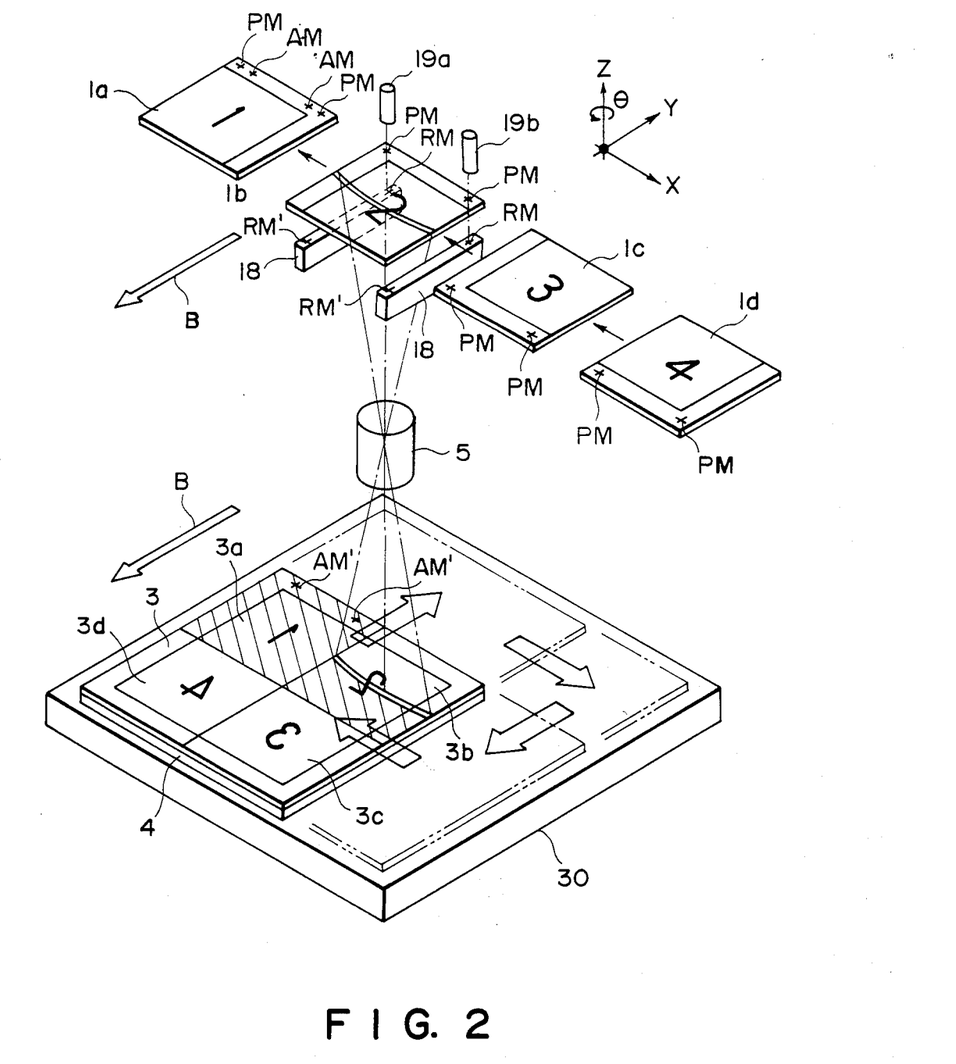
FIG. 2 is a schematic view for explicating the manner of alignment and exposure, according to the embodiment of FIG. 1.

In the present embodiment, as is best seen in FIG. 2, the surface of the base plate 3 is divided into four zones or shot areas 3a–3d. These shot areas 3a–3d are moved, in sequence and by stepwise movements of the base-plate stage 4 in the X and Y directions, into an exposure field defined underneath the projection optical system 5, such that they are exposed to respective mask patterns in sequence. By this, the patterns of the masks 1a–1d, which cooperate to provide "one pattern" on "one layer" of the liquid crystal panel display device, are photoprinted on the whole surface of the base plate 3. Denoted at 15 in FIG. 1 is a mirror which is cooperable with the laser interferometer system 14, for reflecting laser beams emitted from the interferometer system 14 for the measurement of the position or the amount of movement of the base-plate stage 4 in the X and Y directions. The mirror 15 has a substantially L-shape as viewed from the above and is called "square". The mirror 15 is mounted on a $\theta$ table of the base-plate stage 4. The exposure apparatus further includes driving means such as motors for moving the base-plate stage 4 in the X and Y directions. In FIG. 1, only the X-direction driving motor is illustrated at 16. The exposure apparatus is further provided with an alignment detecting system 19 which comprises microscopes 19a and 19b. As is best seen in FIG. 2, the alignment detecting system 19 is arranged to detect, through the microscopes 19a and 19b, the positional relation (positional deviation) of alignment marks PM of the mask that is placed on the mask stage 2, with respect to reference marks RM (or RM') formed on the reference block 18. Also, the alignment detecting system 19 is arranged to detect, where the mask 1a is held on the mask stage 2, the positional relation (positional deviation) of alignment marks AM' formed in the first shot area 3a of the base plate 3, with respect to alignment marks AM provided on the mask 1a. The microscopes 19a and 19b are at the illustrated positions when the mask 1a or 1b is to be aligned with the reference position by use of the alignment marks PM and RM. On the other hand, when the mask 1c or 1d is to be aligned with the reference position by use of the alignment marks PM and RM', the microscopes 19a and 19b are moved to positions which are displaced in the Y direction from the illustrated positions. Also, in order to allow detection of the alignment marks AM of the mask 1a, the microscopes 19a and 19b are moved in the X direction to reduce the spacing therebetween.

Denoted at 20 in FIG. 1 is a control unit provided to control various operations of the apparatus of the present embodiment. More specifically, the control unit 20 is arranged to control movement of the mask stage 2 and the base-plate stage 4 in accordance with the measurement or detection by the laser interferometer system 14 and the alignment detecting system 19. Also, the control unit 20 is arranged to control the operation of the mask feeder 11 so as to replace the mask held on the mask stage 2 by a subsequent mask, each time the exposure of one shot area on the base plate 3 is completed. In the present embodiment, the masks 1a-1d are used in sequence and in this order. The control unit 20 is also adapted to control the movement of the base-plate stage 4 on the basis of the measurement by the laser interferometer system 14, so as to displace the base plate 3 by a preset amount each time the exposure of one shot area is completed.

Referring now to FIG. 2, details of the alignment and exposure operation of the FIG. 1 embodiment will be described. This alignment and exposure operation is executed in regard to the formation of patterns on each of the second layer, the third layer, etc. of the panel display device. In other words, in the state of FIG. 2, at least one pattern has already been photoprinted on each of the shot areas 3a-3d of the base plate 3. Also, the alignment marks AM' have already been formed on the peripheral portion of the first shot area 3a, as illustrated in FIG. 2. The first to fourth masks 1a-1d have respective patterns which are to be photolithographically transferred onto corresponding shot areas 3a-3d of the base plate 3. The patterns of the masks 1a-1d may be different from each other, such as in this embodiment. Denoted at 30 in FIG. 2 is a bottom plate of the holder 9.

Where the first shot area 3a of the base plate 3 is to be exposed to light passed through the first mask 1a, the mask 1a is placed on and held by the mask stage 2. Thereafter, by using the microscopes 19a and 19b, the alignment detecting system 19 detects the positional relation of the alignment marks PM of the mask 1a with the reference marks RM. In accordance with the detection by the alignment detecting system 19, the mask stage 2 is moved under the influence of the control unit 20 so as to establish a predetermined positional relation between these alignment marks, thereby to accurately place the mask 1a at the reference position. By this, the alignment or positioning of the mask 1a is accomplished. For the alignment of the base plate 3, the alignment detecting system 19 operates again to detect, by use of the microscopes 19a and 19b and by way of the projection optical system 5, the positional relation of the alignment marks AM', formed on the base plate 3 by the preceding photolithographic process, with the alignment marks AM of the mask 1a. In accordance with the result of detection, the base-plate stage 4 is moved under the influence of the control unit 20 so as to accurately align the first shot area 3a with the mask 1a. After this, the mask 1a is irradiated with light from the illumination system 6, having a shape of an arcuate slit. While continuing such illumination of the mask 1a, the holder 9 is moved in the direction of allow B, whereby the first shot area 1a is scanningly exposed to the light passed through the mask 1a.

In order to execute the exposure of the second shot area 3b of the base plate 3 to the pattern of the second mask 1b, the mask 1b is placed on and held by the mask stage 2, in substitution for the mask 1a. Then, by use of the microscopes 19a and 19b, the positional relation of the alignment marks PM of the mask 1b with the reference marks RM is detected in a similar way. In accordance with the result of detection, the mask stage 2 is moved under the influence of the control unit 20 so as to establish a predetermined positional relation between these marks, thereby to accurately place the mask 1b at the reference position. Thereafter, the stage 4 is moved to displace the base plate 3 while monitoring or measuring the position (or the amount of movement) of the base plate 3 by use of the laser interferometer system 14 and the mirror (square) 15 provided on the stage 4. Such movement of the stage 4 is continued until the value obtained by the measurement at the laser interferometer system 14 becomes equal to a predetermined value, which has been preset in regard to the second shot area 3b. By this, the base plate 3 is moved stepwise so that the shot area 3b is accurately positioned in the projection field defined underneath the projection optical system 5. It will be readily understood from the foregoing that the position of the base plate 3, assumed at the time of completion of the alignment of the first shot area 3a of the mask 1a, is used as the reference or start position from which the stepwise movement for bringing the second shot area 3b into the projection field (exposure station) starts. After completion of the positioning of the second shot area 3b, the holder 9 starts movement while retaining the positional relation between the shot area 3b and the mask 1b. Thus, the pattern of the mask 1b is photolithographically transferred onto the shot area 3b. The exposure of the third shot area 3c to the pattern of the third mask 1c and the exposure of the fourth shot area 3d to the pattern of the fourth mask 1d are executed essentially in the same manner as has been described with reference to the exposure of the escond shot area 3b. ·

In this way, the patterns of the masks 1a-1d are photoprinted on the shot areas 3a-3d of the base plate 3, respectively. After this, the mask feeder 11 operates to place the mask 1a again on the mask stage 2, and the base plate 3 carried on the stage 4 is replaced by a subsequent base plate by means of a handler, not shown.

Figure 3:
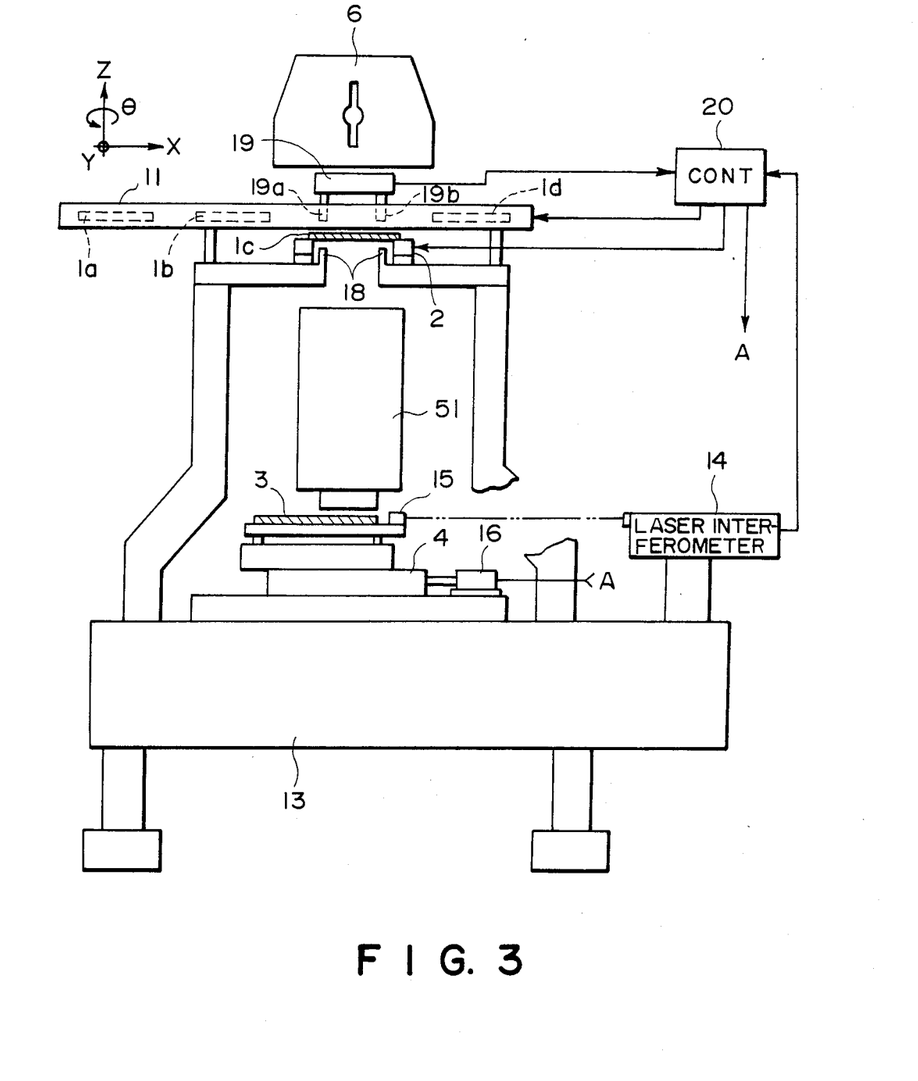
FIG. 3 is a schematic and diagrammatic view of an exposure apparatus according to another embodiment of the present invention.

FIG. 3 is a schematic view showing a general structure of an exposure apparatus according to another embodiment of the present invention. In this embodiment, the present invention is applied to a step-and-repeat type exposure apparatus wherein a lens projection optical system is used to photolithographically forming a large-size pattern on a large-size workpiece by sequential or step-and-repeat exposures. Like numerals as of the FIG. 1 embodiment denote similar or corresponding elements.

In the embodiment of FIG. 3, the apparatus includes a lens projection optical system 51 comprising a plurality of lens elements. The projection optical system 51 is adapted to project, on a base plate 3, an image of a pattern of a mask that has been accurately placed on a reference position by means of a mask stage 2. The apparatus further includes an illumination system 6 and a base-plate system 4. The mask stage 2, the base-plate stage 4, the illumination system 6 and the projection optical system 51 are all supported by a base 13 in the illustrated positional interrelation. The remaining portion of the exposure apparatus of the FIG. 3 embodiment has the same structure as of the corresponding portion of the FIG. 1 embodiment. The projection optical system 51 of the present embodiment may have an enlarging projection magnification, a unit projection magnification or a reducing projection magnification. The alignment and exposure operation of the apparatus of the present embodiment is the same as of the FIG. 1 apparatus, except for the point that moving the mask stage 2 and the base-plate stage 4 as a unit during the exposure is unnecessary in the former.

Figure 4:
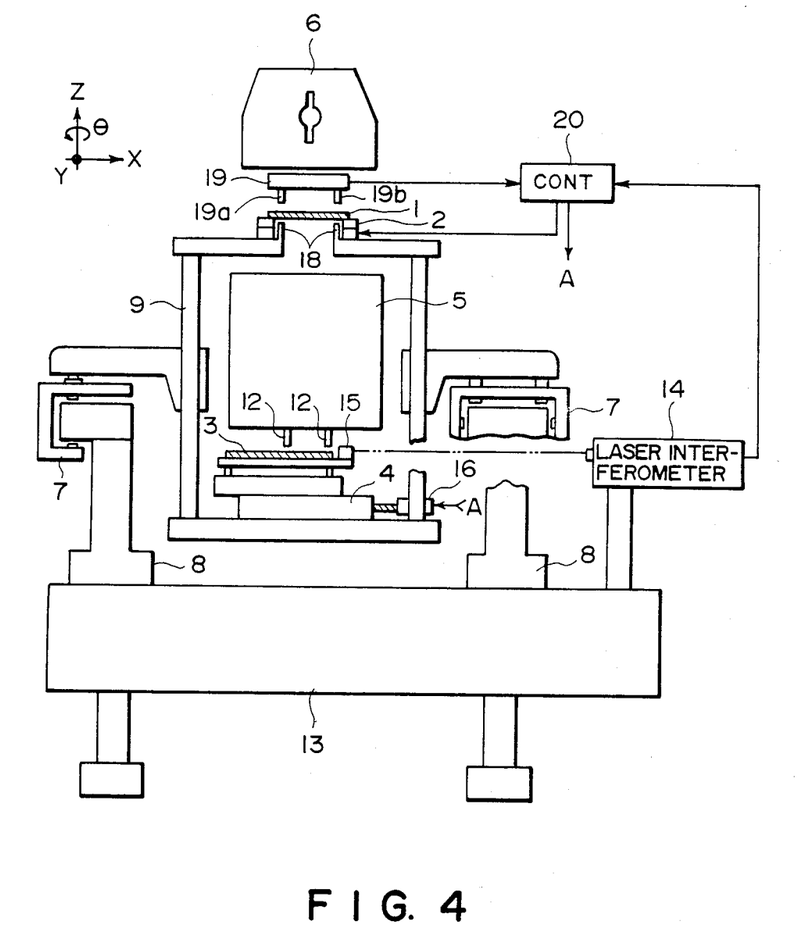
FIG. 4 is a schematic and diagrammatic view of an exposure apparatus according to a further embodiment of the present invention.

FIG. 4 shows an exposure apparatus according to a further embodiment of the present invention. In this embodiment, the invention is applied to an exposure apparatus of step-and-scan type, similar to the FIG. 1 embodiment. An important feature of the present embodiment, as compared with the FIG. 1 embodiment, is that the mask feeder 11 is omitted. In other words, in the exposure apparatus of the FIG. 4 embodiment, the same pattern of the same mask denoted at 1 is photoprinted on each of the shot areas 3a–3d of the base plate 3. The remaining portion of the apparatus of the present embodiment has essentially the same structure as of the corresponding portion of the FIG. 1 embodiment, and like numerals as of the FIG. 1 embodiment denote similar or corresponding elements.

Where the first shot area of the base plate 3 is to be photoprinted, the mask 1 is accurately placed at a mask reference position. Such mask alignment is achieved by use of microscopes 19a and 19b and on the basis of detection of the positional relation between alignment marks of the mask 1 and reference marks provided on a reference block 18 of the apparatus. Thereafter, by use of the microscopes 19a and 19b and by way of the projection optical system 51, the positional relation between another set of alignment marks of the mask 1 and alignment marks of the base plate 3, formed during the preceding photolithographic process, is detected. In accordance with the result of detection, the stage 4 is moved to bring the mask 1 and the base plate 3 into alignment with each other, with respect to the first shot area. Thereafter, the exposure of the first shot area is executed.

Subsequently, for the exposure of the second shot area, the base plate 3 is moved stepwise while the mask 1 is still held at the reference position. During such movement, the position or the amount of movement of the base plate 3 is monitored or measured by use of a laser interferometer system 14 and a mirror (square) 15 provided on the stage 4, such that the base plate 3 is accurately moved stepwise to a predetermined position, having been set for the second shot area. After completion of the positioning of the base plate 3 in regard to the second shot area, the exposure of the second shot area to the pattern of the mask 1 is executed. Exposures of the third and fourth shot areas are carried out in the same manner.

While, in the foregoing, the invention has been described with reference to projection type step-and-repeat exposure apparatuses using a projection optical system, the invention is not limited to such projection type exposure apparatuses. That is, the present invention is applicable also to contact type exposure apparatuses and proximity type exposure apparatuses, provided that the photolithographic process is executed in the step-and-repeat manner.

While the invention has been described with reference to the structures disclosed herein, it is not confined to the details set forth and this application is intended to cover such modifications or changes as many come within the purposes of the improvements or the scope of the following claims.

What is claimed is:

1. An exposure apparatus for photolithographically transferring patterns of different originals onto different portions of a workpiece, said apparatus comprising:
    means for exposing, in sequence, the portions of the workpiece to the patterns of the corresponding originals with radiation;
    means for positioning one of the originals having the pattern that is just going to be transferred onto one of the portions of the workpiece;
    first detecting means for detecting a positional relation between an alignment mark provided on one of the originals and an alignment mark formed on the workpiece;
    second detecting means for detecting the position of the workpiece; and
    control means operable, when a first one of the portions of the workpiece is to be exposed to the pattern of a corresponding first one of the originals, to position the first portion of the workpiece relative to the first original, having been positioned by said positioning means, in accordance with the detection by said first detecting means, said control means being operable, when a second one of the portions of the workpiece is to be exposed to the pattern of a corresponding second one of the originals, to position the second portion of the workpiece relative to the second original, having been positioned by said positioning means, in accordance with the detection by said second detecting means.

2. An apparatus according to claim 1, wherein said second detecting means comprises a laser interferometer.

3. An apparatus according to claim 1, wherein said exposing means comprises a projection optical system for scanningly exposing the portions of the workpiece to the patterns of the corresponding originals, in sequence.

4. An apparatus according to claim 1, wherein said exposing means comprises a lens projection optical system for projecting an image of the pattern of each original onto one of the portions of the workpiece, corresponding to the original.

5. An exposure apparatus for photoprinting images of an original onto different portions of a workpiece in sequence, said apparatus comprising:
- means for exposing, in sequence, the portions of the workpiece to the images of the original with radiation;
- first detecting means for detecting a positional relation between an alignment mark provided on the original and an alignment mark formed in a first portion of the workpiece;
- second detecting means for detecting the position of the workpiece; and
- control means operable, when the first portion of the workpiece is to be exposed to the image of the original, to position the workpiece relative to the original in accordance with the detection by said first detecting means, said control means being operable, when a second one of the portions of the workpiece is to be exposed to the image of the original, to position the workpiece relative to the original in accordance with the detection by said second detecting means.

6. An apparatus according to claim 5, wherein said second detecting means comprises a laser interferometer.

7. An apparatus according to claim 5, wherein said exposing means comprises a projection optical system for scanningly exposing the portions of the workpiece to images of the pattern of the original, in sequence.

8. An apparatus according to claim 5, wherein said exposing means comprises a lens projection optical system for projecting an image of the pattern of the original onto each of the portions of the workpiece.

9. An apparatus for exposing, with radiation, different portions of a workpiece in sequence, said apparatus comprising:
- means for exosing, with radiation and at an exposure position, one of the portions of the workpiece;
- means for moving the workpiece relative to the exposure position so that the portions of the workpiece are exposed in sequence;
- first detecting means for detecting a mark formed on the workpiece, after a first one of the portions of the workpiece, which is to be exposed at first, is moved to the exposure position by said moving means;
- second detecting means for detecting a value concerning the movement of the workpiece by said moving means; and
- control means for controlling said moving means so that the portions of the workpiece are moved to the exposure position in sequence, said control means being adapted to control, in relation to the exposure of the first portion of the workpiece, said moving means in accordance with the detection by said first and second detecting means, and said control means being adapted to control, in relation to the exposure of a second portion of the workpiece, said moving means in accordance with the detection by said detecting means.

10. An apparatus according to claim 9, wherein said second detecting means comprises a laser interferometer.

* * * * *

UNITED STATES PATENT AND TRADEMARK OFFICE
CERTIFICATE OF CORRECTION

PATENT NO. : 4,708,466
DATED : November 24, 1987
INVENTOR(S) : JUNJI ISOHATA, ET AL.

It is certified that error appears in the above-identified patent and that said Letters Patent is hereby corrected as shown below:

COLUMN 1

Line 62, "stepwisely" should read --stepwise--.

COLUMN 2

Line 16, "borders" should read --border--.
Line 57, "stepwisely" should read --stepwise--.

COLUMN 3

Line 30, "expose" should read --exposing--.

COLUMN 4

Line 7, "is" should be deleted.
Line 23, "LAB 8" should read --LAB 7--.
Line 25, "is" should be deleted.
Line 26, "stage and" should read --stage 2 and--.
Line 61, "at" should read --by--.

COLUMN 5

Line 30, "at" should read --by--.
Line 63, "at" should read --by--.

COLUMN 6

Line 23, "allow B," should read --arrow B,--.
Line 64, "escond" should read --second--.

UNITED STATES PATENT AND TRADEMARK OFFICE
CERTIFICATE OF CORRECTION

PATENT NO. : 4,708,466

DATED : November 24, 1987

INVENTOR(S) : JUNJI ISOHATA, ET AL.

It is certified that error appears in the above-identified patent and that said Letters Patent is hereby corrected as shown below:

COLUMN 7

Line 9, "to" should read --for--.
    Line 21, "system 4." should read --stage 4.--.

COLUMN 8

Line 27, "many" should read --may--.

COLUMN 10

Line 8, "exosing," should read --exposing,--.

Signed and Sealed this

Ninth Day of August, 1988

Attest:

DONALD J. QUIGG

*Attesting Officer*    *Commissioner of Patents and Trademarks*